United States Patent
Seo et al.

(10) Patent No.: US 7,449,359 B2
(45) Date of Patent: Nov. 11, 2008

(54) FABRICATING METHOD OF CMOS IMAGE SENSOR

(75) Inventors: Dong Hee Seo, Chungcheongbuk-do (KR); Chee Hong Choi, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 212 days.

(21) Appl. No.: 11/319,570

(22) Filed: Dec. 29, 2005

(65) Prior Publication Data

US 2006/0148159 A1    Jul. 6, 2006

(30) Foreign Application Priority Data

Dec. 30, 2004 (KR) .................. 10-2004-0116424
Dec. 30, 2004 (KR) .................. 10-2004-0116425

(51) Int. Cl.
*H00L 21/00* (2006.01)
(52) U.S. Cl. .................. 438/69; 438/60; 438/70; 438/74; 438/E27.151; 257/436
(58) Field of Classification Search .............. 438/60, 438/69–71, 73–75, 29; 257/E27.151, 436
See application file for complete search history.

(56) References Cited

U.S. PATENT DOCUMENTS 7,064,405 B2 * 6/2006 Kondo et al. .............. 257/436
2005/0274968 A1 * 12/2005 Kuo et al. .................. 257/98

FOREIGN PATENT DOCUMENTS

CN         1734745        2/2006
KR     10-20020042098    6/2002

\* cited by examiner

*Primary Examiner*—Dung A. Le
(74) *Attorney, Agent, or Firm*—McKenna Long & Aldridge LLP

(57) ABSTRACT

A fabricating method of a CMOS image sensor is disclosed, by which a light condensing effect is enhanced by providing an inner microlens to a semiconductor substrate. The CMOS image sensor includes a plurality of photodiodes on a semiconductor substrate, a plurality of inner microlenses on a plurality of the photodiodes, an insulating interlayer on a plurality of the inner microlenses, a plurality of metal lines within the insulating interlayer, a device protecting layer on the insulating interlayer, and a plurality of microlenses on the device protecting layer.

1 Claim, 10 Drawing Sheets (A) (B)

FABRICATING METHOD OF CMOS IMAGE SENSOR

This application claims the benefit of Korean Patent Application No. 10-2004-0116424, filed on Dec. 30, 2004, and Korean Patent Application No. 10-2004-0116425, filed on Dec. 30, 2004, which are hereby incorporated by reference for all purposes as if fully set forth herein.

BACKGROUND OF THE INVENTION

1. Field of the Invention

The present invention relates to a CMOS image sensor and fabricating method thereof. The present invention is suitable for a wide scope of applications, and is particularly suitable for enhancing a light condensing effect by providing an inner microlens on a semiconductor substrate.

2. Discussion of the Related Art

An image sensor is a semiconductor device that converts an optical image to an electric signal. In a CCD (charge coupled device) image sensor, a plurality of MOS (metal-oxide-metal) capacitors are arranged close to one another to transfer and store electric charge carriers. In a CMOS (complementary MOS) image sensor, a plurality of MOS transistors corresponding to a number of pixels and are fabricated by CMOS technology. CMOS technology uses a control circuit and a signal processing circuit as peripheral circuits, and a switching system of detecting outputs step by step using the MOS transistors.

The CMOS image sensor includes signal processing chips including photodiodes. CMOS image sensors are advantageous in their degree of integration since an amplifier, an analog/digital (A/D) converter, an inner voltage generator, a timing generator, a digital logic, etc. can be integrated on each of the chips. The CMOS image sensor is also advantageous in power and cost reductions. Moreover, mass production of the CMOS image sensor is enabled through an etching process of a silicon wafer that is cheaper than a fabricating process of a CCD. The CCD is fabricated through a special process. Thus, the image sensor has expanded into application fields such as digital cameras, smart phones, PDAs (personal digital assistants), notebook computers, security cameras, barcode detectors, and toys.

As the size of CMOS image sensors reduces because of high degrees of integration, the pixel size is decreased. Thus, a fill factor, which indicates a rate of a pixel area within a chip, generally becomes only approximately 30-40%. Thus, photosensitivity cannot be maximized. A method of increasing the fill factor has been proposed to raise the photosensitivity, however, a logic circuit part for signal processing still puts limitations on the corresponding area. Hence, a microlens (ML), which includes a photoresist layer to enable maximum light absorption with a photodiode, condenses light by diverting a path of the light incident on an area except the photodiode. The microlens is mainly used to maximize the intensity of the incident light.

A method of fabricating a CMOS image sensor with a microlens according to a related art is explained with reference to FIG. 1 as follows.

Referring to FIG. 1, a plurality of epitaxial layers (not shown) may be formed on a semiconductor substrate 10. A plurality of photodiodes 18 are formed on the epitaxial layer. In particular, a first epitaxial layer (not shown) may be grown on the semiconductor substrate 10, a red photodiode (not shown) may be formed on the first epitaxial layer, a second epitaxial layer (not shown) may be grown on the first epitaxial layer including the red photodiode, and a green photodiode (not shown) may be then formed on the second epitaxial layer.

A third epitaxial layer (not shown) may be grown on the second epitaxial layer including the green photodiode, a blue photodiode (not shown) may be formed on the third epitaxial layer, and a trench for field isolation is formed on the third epitaxial layer. An STI (shallow trench isolation) layer 11 is then formed by filling the trench with an insulating material.

An insulating interlayer 13 is formed on the third epitaxial layer, a first metal layer (not shown) may be formed on the insulating interlayer 13, and a metal line 14 is then formed by patterning the first metal layer. The process of forming the insulating interlayer 13 and the metal line 14 is repeated several times to stack the interlayer 13 and the metal line 14.

Then, a color filter layer 15 is formed on the insulating interlayer 14. A device protecting insulating layer 16 is formed on the color filter layer 15 to protect a device from moisture or physical shock. A microlens 17 is then formed on the device protecting insulating layer 16.

However, when fabricating the CMOS image sensor according to the related art, the microlens 17 formed on a top layer is dependent on a focal length between the semiconductor substrate 10 and the top layer. Hence, a light refracted by a lateral side of the microlens 17 having a long focal length does not enter the photodiode. Instead, the light enters a neighboring pixel that results in optical crosstalk between neighboring pixels.

SUMMARY OF THE INVENTION

Accordingly, the present invention is directed to a CMOS image sensor and fabricating method thereof that substantially obviate one or more of the problems due to limitations and disadvantages of the related art.

An advantage of the present invention is to provide a CMOS image sensor and fabricating method thereof, by which a light condensing effect is enhanced by providing an inner microlens between a photodiode and a microlens.

Additional features and advantages of the invention will be set forth in the description which follows, and in part will be apparent from the description, or may be learned by practice of the invention. The objectives and other advantages of the invention will be realized and attained by the structure and method particularly pointed out in the written description and claims hereof as well as the appended drawings.

To achieve these and other advantages and in accordance with the purpose of the present invention, as embodied and broadly described, a CMOS image sensor according to the present invention includes a plurality of photodiodes on a semiconductor substrate, a plurality of inner microlenses on a plurality of the photodiodes, an insulating interlayer on a plurality of the inner microlenses, a plurality of metal lines within the insulating interlayer, a device protecting layer on the insulating interlayer, and a plurality of microlenses on the device protecting layer.

In another aspect of the present invention, a plurality of the inner microlenses are formed within the semiconductor substrate to correspond to a plurality of the photodiodes, respectively.

In another aspect of the present invention, the semiconductor substrate is formed of silicon having an inverse triangle type profile due to an etched degree that varies according to a crystalline direction when etched using an etchant.

In another aspect of the present invention, the semiconductor substrate is formed of silicon having a crystalline structure of (1,0,0).

In another aspect of the present invention, a CMOS image sensor includes a plurality of photodiodes on a semiconductor substrate, a first insulating interlayer on a plurality of the photodiodes, a first metal line within the first insulating interlayer, a plurality of inner microlenses on the first insulating interlayer, a second insulating interlayer on a plurality of the inner microlenses, a second metal line within the second insulating interlayer, a device protecting layer on the second insulating interlayer, and a plurality of microlenses on the device protecting layer.

In another aspect of the present invention, the CMOS image sensor further includes a silicon layer attached to the first insulating interlayer wherein a plurality of the inner microlenses are formed within the silicon layer to correspond to a plurality of the photodiodes, respectively.

In another aspect of the present invention, the silicon layer is formed of silicon having an inverse triangle type profile due to an etched degree that varies according to a crystalline direction when etched using an etchant.

In another aspect of the present invention, the semiconductor substrate is formed of silicon having a crystalline structure of (1,0,0).

In another aspect of the present invention, a method of fabricating a CMOS image sensor includes forming a plurality of photodiodes on a semiconductor substrate, forming a plurality of inner microlenses on a plurality of the photodiodes, alternately forming insulating interlayers and metal lines on a plurality of the inner microlenses to thereby form the insulating interlayer on the metal line, forming a device protecting layer on the insulating interlayer, and forming a plurality of microlenses on the device protecting layer.

In another aspect of the present invention, wherein forming a plurality of inner microlenses includes forming a photoresist pattern on the semiconductor substrate to expose an area corresponding to a plurality of the photodiodes, forming concave recesses by wet etching performed on the semiconductor substrate using the photoresist pattern as a mask, and forming a nitride layer on the semiconductor substrate including the concave recesses.

In another aspect of the present invention, the concave recesses forming step includes the steps of generating an inverse triangle type profile by performing the wet etching on the semiconductor substrate and rounding the inverse triangle type profile by chemical dry etching to form each of the concave recesses.

In another aspect of the present invention, a method of fabricating CMOS image sensor includes the steps of forming a plurality of photodiodes on a semiconductor substrate, alternately forming first insulating interlayers and first metal lines on a plurality of the photodiodes to thereby form the first insulating interlayer on the first metal line, forming a plurality of inner microlenses on the first insulating interlayer, alternately forming second insulating interlayers and second metal lines on a plurality of the inner microlenses to thereby form the second insulating interlayer on the second metal line, forming a device protecting layer on the second insulating interlayer, and forming a plurality of microlenses on the device protecting layer.

In another aspect of the present invention, wherein forming a plurality of inner microlenses includes attaching a silicon layer on the first insulating layer wherein oxide layers are coated on top and bottom surfaces of the silicon layer, respectively, forming a photoresist pattern on the silicon layer to expose an area corresponding to a plurality of the photodiodes, forming concave recesses by wet etching performed on the silicon layer using the photoresist pattern as a mask, and forming a nitride layer on the semiconductor substrate including the concave recesses.

In another aspect of the present invention, wherein forming concave recesses includes generating an inverse triangle type profile by performing the wet etching on the silicon layer, removing an oxide layer from a top surface of the silicon layer, and rounding the inverse triangle type profile by chemical dry etching to form each of the concave recesses.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiment(s) of the invention and together with the description serve to explain the principle of the invention. In the drawings.

DETAILED DESCRIPTION OF THE INVENTION

Reference will now be made in detail to embodiments of the present invention, examples of which are illustrated in the accompanying drawings. Wherever possible, the same reference designations will be used throughout the drawings to refer to the same or similar parts.

Figure 1:
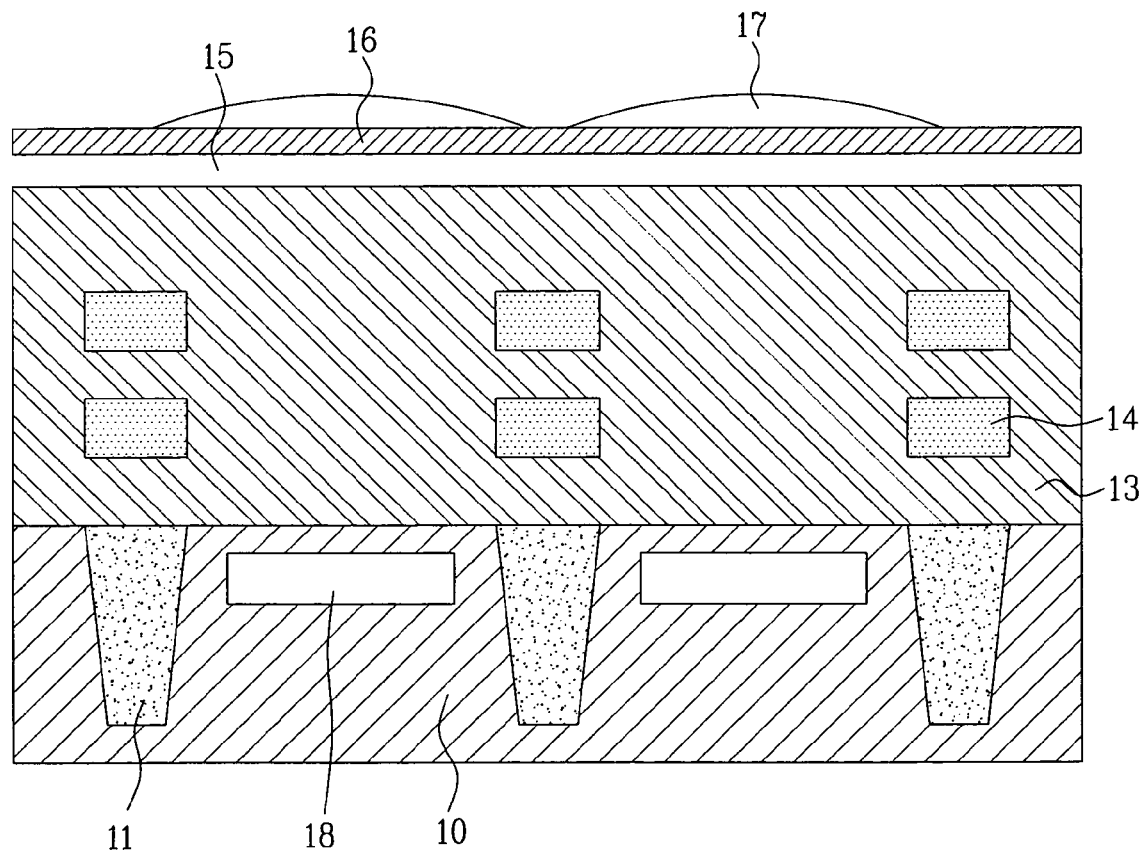
FIG. 1 is a cross-sectional diagram of a CMOS image sensor fabricated by a CMOS image sensor fabricating method according to a related art.
Figure 2:
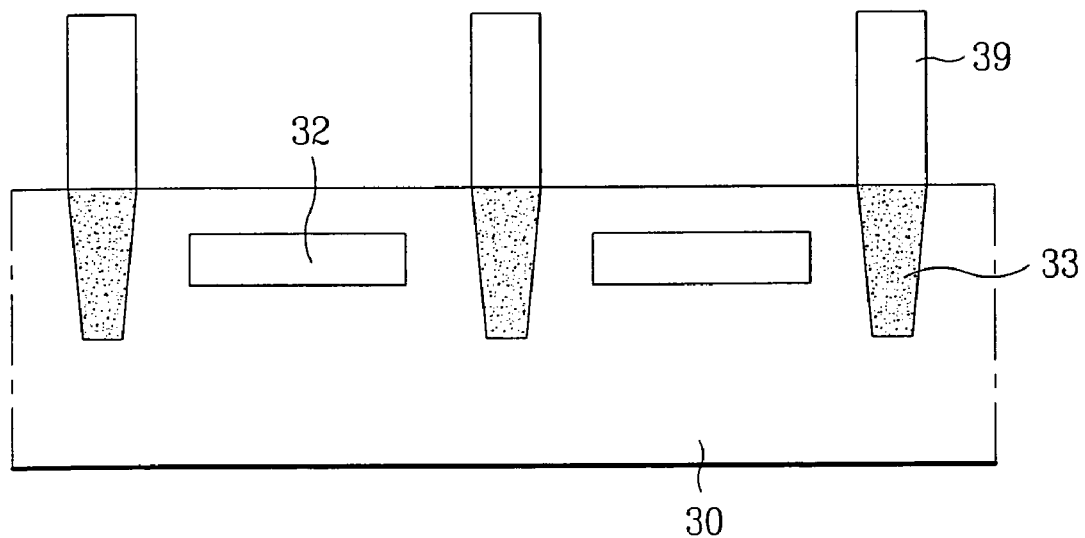
FIGS. 2 to 5 are cross-sectional diagrams of a method of fabricating a CMOS image sensor according to one embodiment of the present invention.

Referring to FIG. 2, a plurality of epitaxial layers (not shown) may be formed on a semiconductor substrate 30. A plurality of photodiodes are formed in a photodiode area 32. For example, a first epitaxial layer (not shown) may be grown on the semiconductor substrate 30, a red photodiode (not shown) may be formed on the first epitaxial layer, a second epitaxial layer (not shown) may be grown over the semiconductor substrate 30 including the red photodiode, and a green photodiode (not shown) may be then formed on the second epitaxial layer. Subsequently, a third epitaxial layer (not shown) may be grown on the second epitaxial layer including the green photodiode, a blue photodiode (not shown) may be formed on the third epitaxial layer, a trench for field isolation is formed on the third epitaxial layer, and an STI (shallow trench isolation) layer 33 is then formed by filling the trench with an insulating material.

A photoresist (not shown) may be coated over the semiconductor substrate 30 including the STI layer 33. A photoresist pattern 39 is then formed by exposure and development to expose an area over the photodiode area 32.

Figure 3:
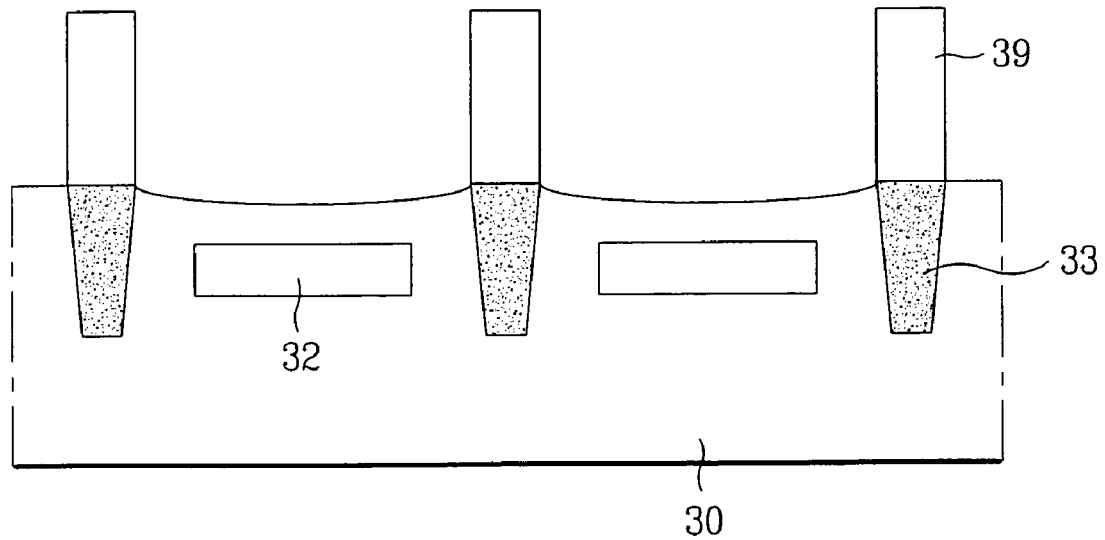

Referring to FIG. 3, wet etching is performed on the semiconductor substrate 30 by an etchant using the photoresist pattern 39 as a mask. In the wet etching that uses the etchant, an etched degree varies according to a crystalline direction.

Figure 7:
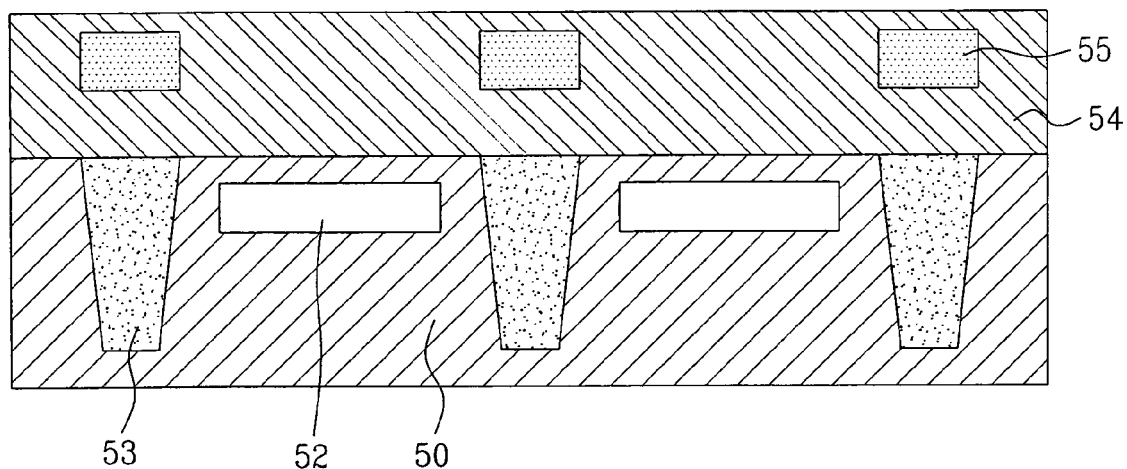
FIGS. 7 to 13 are cross-sectional diagrams of a method of fabricating a CMOS image sensor according to another embodiment of the present invention.

Hence, a (1,0,0)-silicon substrate may be used as the semiconductor substrate 30 to have an inverse triangle type profile. An incline plane of the inverse triangle type profile would then have a (1,1,1) direction, as shown in FIG. 7, which shows a real image of the semiconductor substrate etched by the etchant.

Figure 4:
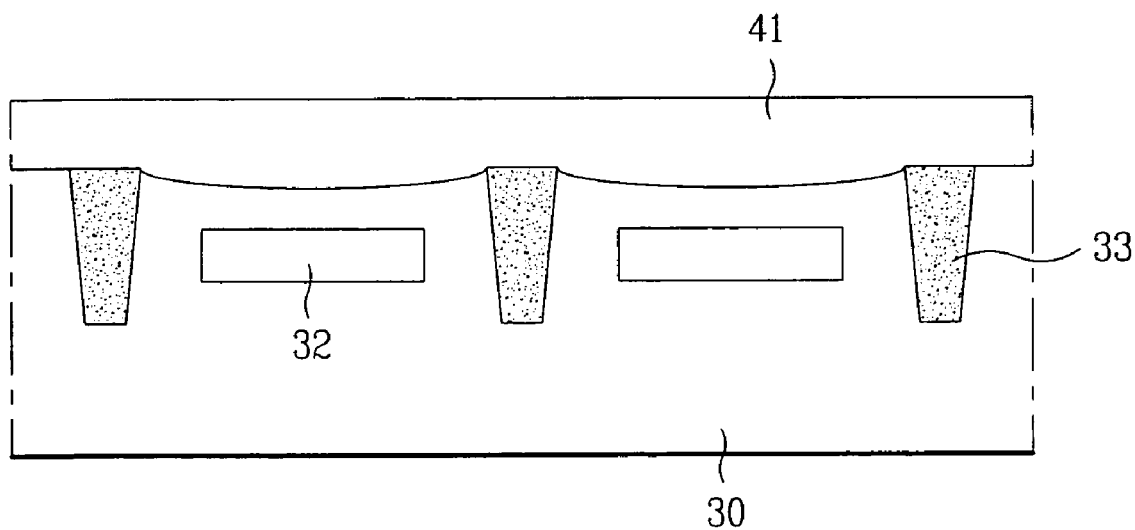

Referring to FIG. 4, the photoresist pattern 39 is removed.

The profile of the etched semiconductor substrate 30 becomes rounded by chemical dry etching process used to round an edge portion of the STI 33.

A nitride layer 41 having a large refractive index is stacked on the rounded semiconductor substrate 30. Chemical mechanical polishing is performed on the nitride layer 41 to form an inner microlens 41.

Figure 5:
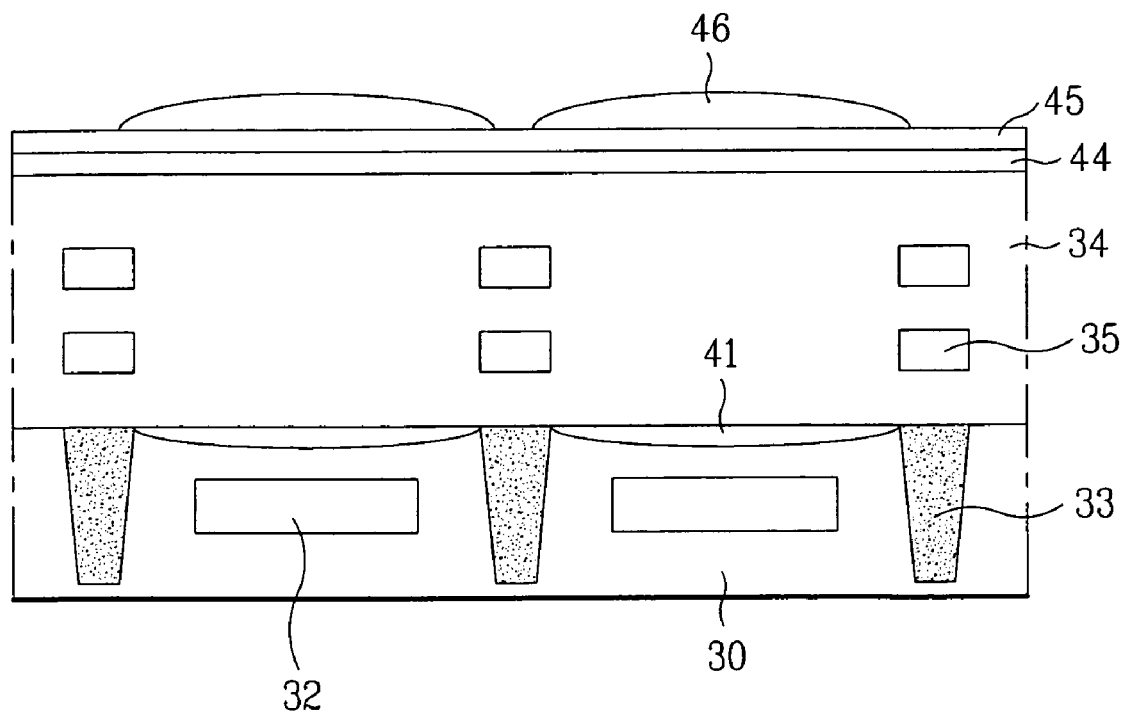
Figure 6:
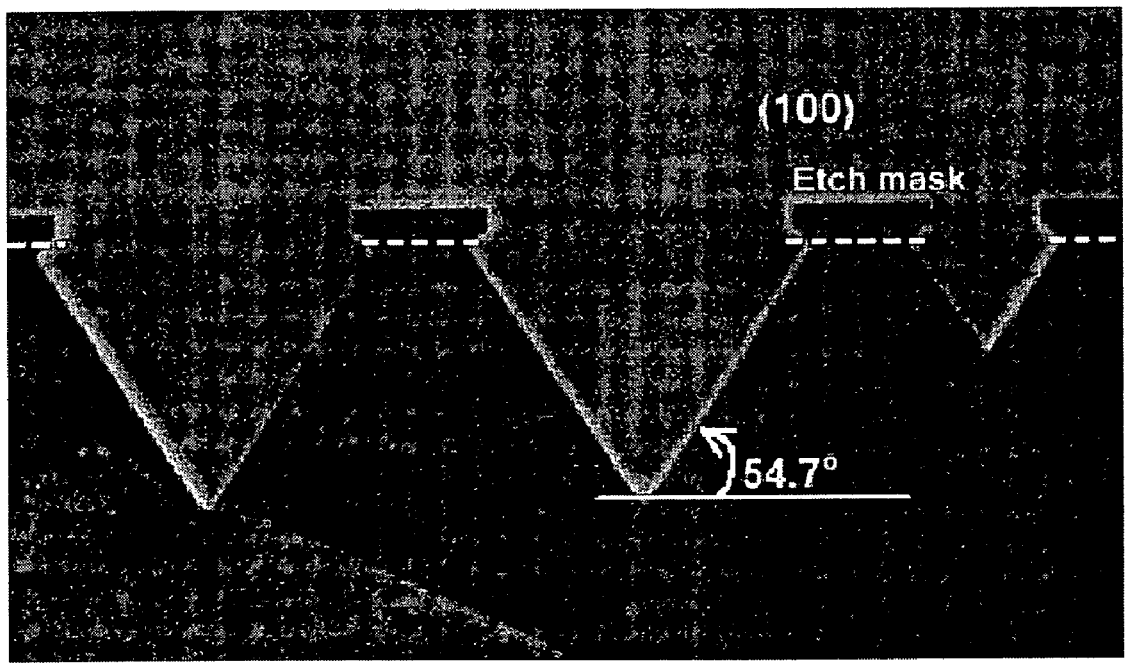
FIG. 6 is a picture of a real image of a semiconductor substrate etched using an etchant.

Referring to FIG. 5, an insulating interlayer 34 is formed over the semiconductor substrate 30 including the inner microlens 41.

A metal layer (not shown) may be formed on the insulating interlayer 34 and may be then patterned to form a metal line 35. In an exemplary embodiment of the present invention, the process of forming the insulating interlayer 34 and the first metal line 35 is repeated several times to form the insulating interlayer 34 and the first metal line 35. Thereby, the insulating interlayer 34 is deposited on the first metal line 35. A color filter layer 44 is formed on the deposited insulating interlayer 34.

A device protecting layer 45, which may be an insulating layer, is deposited on the color filter layer 44 to protect the sensor against moisture or physical shock. Then, a microlens 46 is formed on the device protecting layer 45.

In another embodiment of the present invention, to further increase intensity of light incident on the photodiode by reducing a focal length, the inner microlens is formed by attaching an oxide-coated silicon layer on the insulating interlayer and etching the attached silicon layer, instead of directly etching the semiconductor substrate. This is explained in detail with reference to FIGS. 7 to 13.

Referring to FIG. 7, a plurality of epitaxial layers (not shown) may be formed on a semiconductor substrate 50 and a plurality of photodiodes are formed in a photodiode area 52. The epitaxial layer and photodiode forming processes are similar to that explained with reference to FIG. 2. A first insulating interlayer 54 is deposited on the epitaxial layer.

A first metal layer (not shown) may be formed on the first insulating interlayer 54 and is then patterned to form a first metal line 55. In an exemplary embodiment of the present invention, the process of forming the insulating interlayer 54 and the first metal line 55 is repeated several times to form the insulating interlayer 54 and the first metal line 55. Thereby, the insulating interlayer 54 is deposited on the first metal line 55. An STI (shallow trench isolation) layer 53 is shown.

Figure 8:
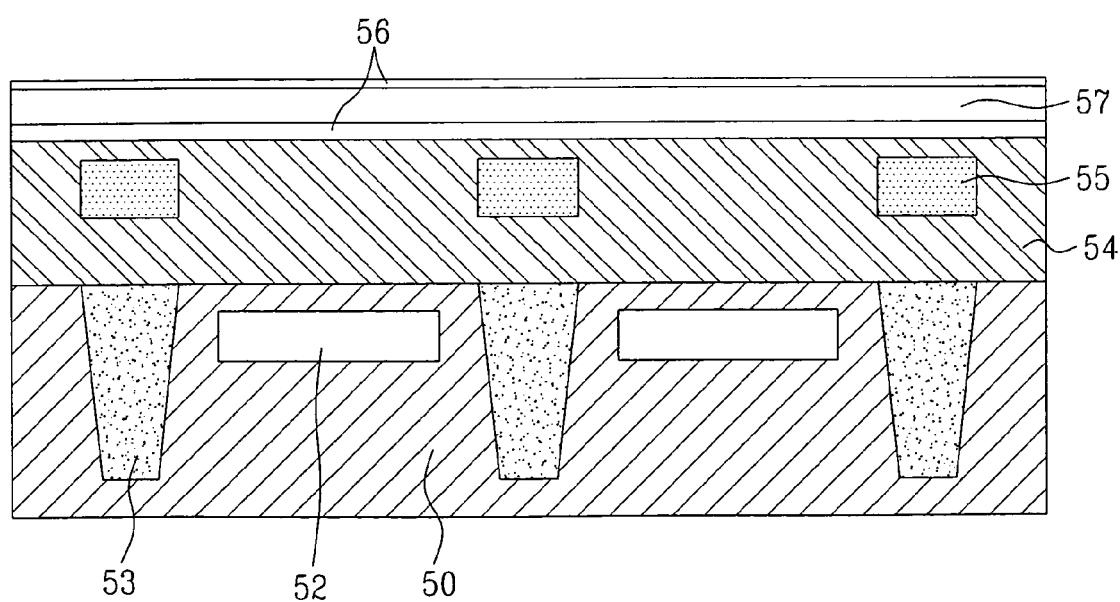

Referring to FIG. 8, a silicon layer 57 is attached on the first insulating interlayer 54. Top and bottom surfaces of the silicon layer 57 may be coated with thermal oxide layers 56, respectively.

Figure 9:
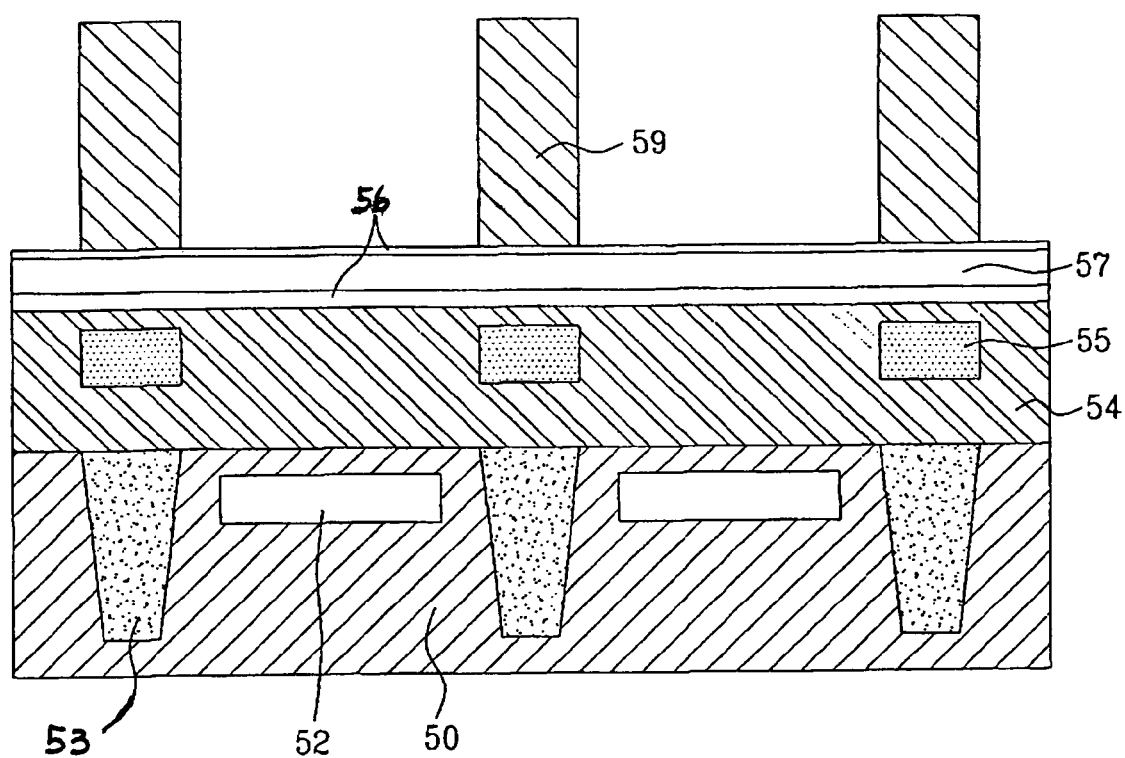

Referring to FIG. 9, a photoresist is coated on the thermal oxide layer 56. Exposure and development are performed on the photoresist to form a photoresist pattern 59 exposing a portion of the thermal oxide layer 56 over the photodiode area 52. The silicon layer 57 is attached to the first insulating interlayer 54 by a technique used in fabricating an SOI (silicon on insulator) wafer.

Figure 10:
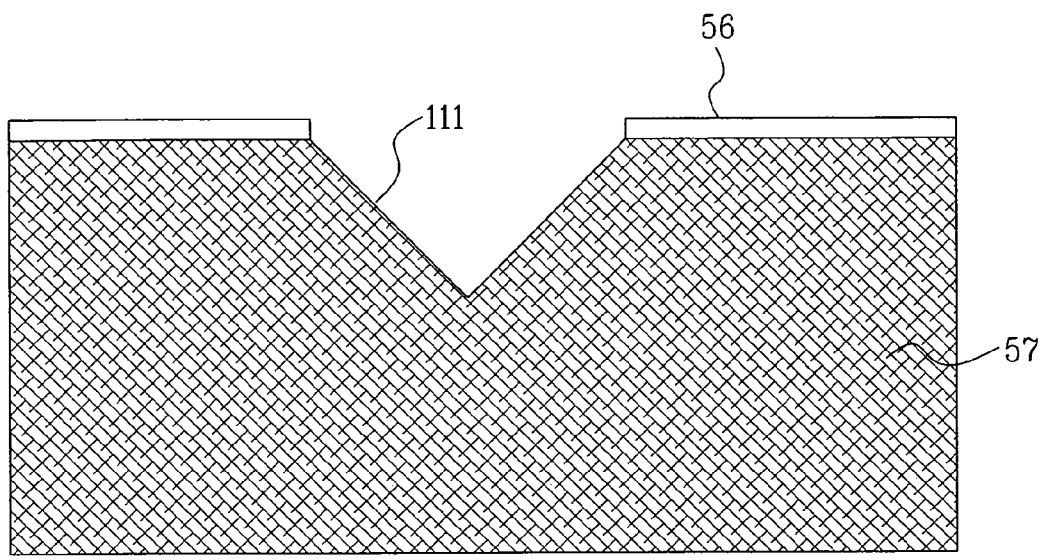

Referring to FIG. 10, wet etching is performed on the silicon layer 57 by an etchant using the photoresist pattern 59 as a mask. The photoresist pattern 59 is then removed. FIG. 10 shows a magnified diagram of the etched silicon layer 57.

In the wet etching that uses the etchant, an etched degree varies according to a crystalline direction. Hence, a (1,0,0)-silicon layer is preferably used as the silicon layer 57 to have an inverse triangle type profile. An incline plane of the inverse triangle type profile has a (1,1,1) direction.

Figure 11:
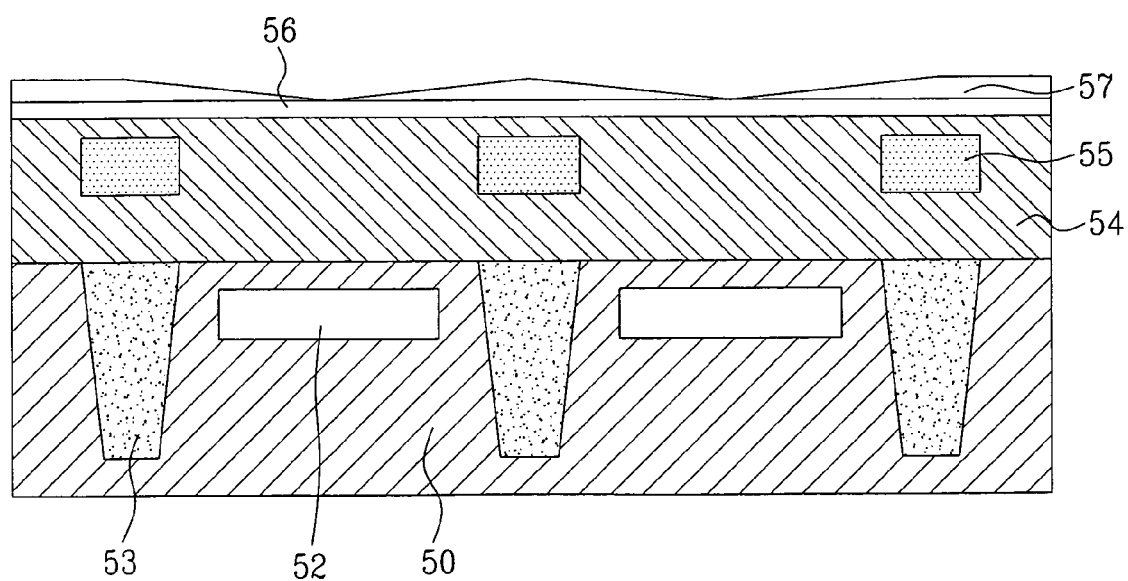

Referring to FIG. 11, the oxide layer 56 on the top surface of the silicon layer 57 may be removed.

The profile of the silicon layer 57 becomes rounded like a lens by a chemical dry etching process that is used in rounding an edge portion of the STI 53.

Figure 12:
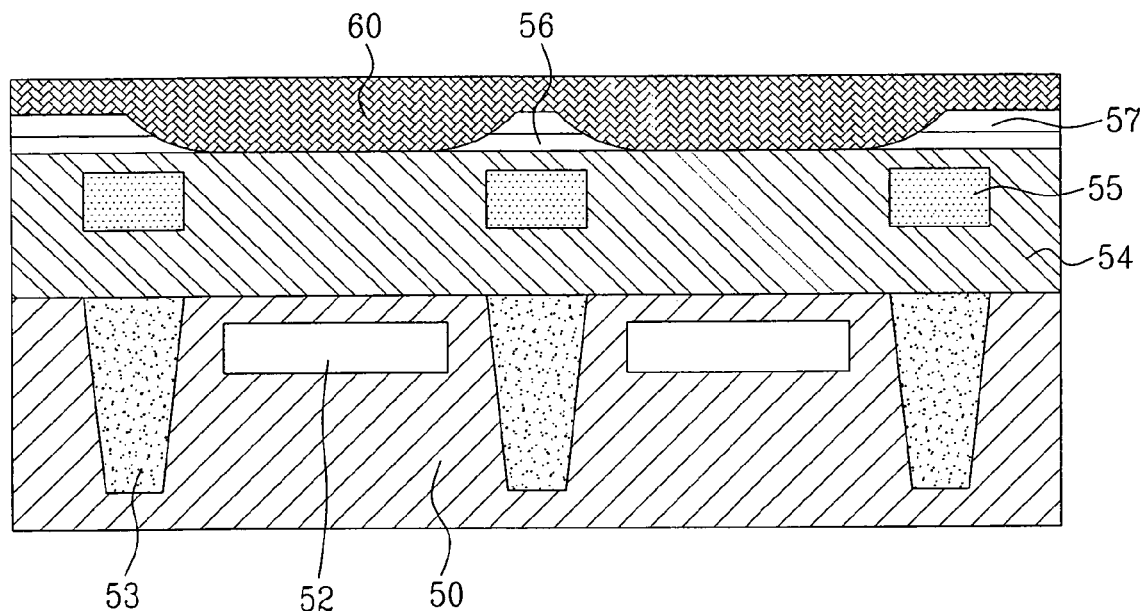

Referring to FIG. 12, a nitride layer 60 having a large refractive index is stacked on the rounded silicon layer 57.

Chemical mechanical polishing is performed on the nitride layer to form an inner microlens 60.

Figure 13:
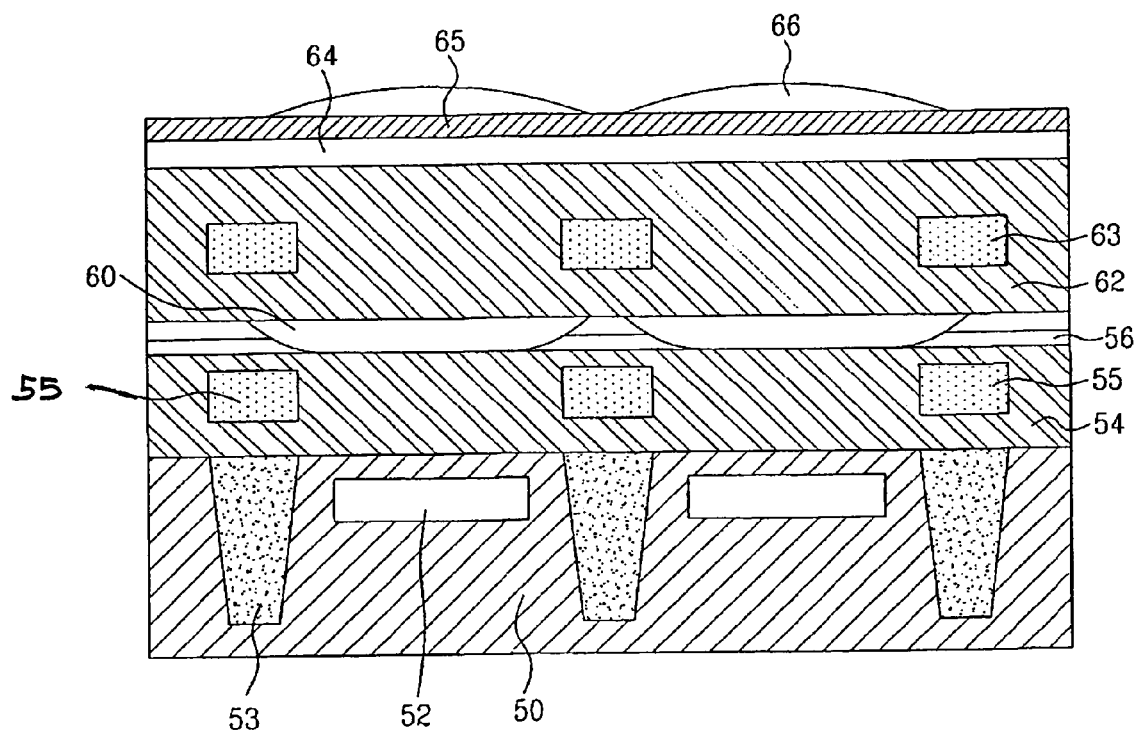

Referring to FIG. 13, a second insulating interlayer 62 is formed over the semiconductor substrate 50 including the inner microlens 60.

A second metal layer (not shown) may be formed on the second insulating interlayer 62 and is then patterned to form a second metal line 63. In an exemplary embodiment of the present invention, the process of forming the second insulating interlayer 62 and the second metal line 63 is repeated several times to form the second insulating interlayer 62 and the second metal line 63. Thereby, the second insulating interlayer 62 is deposited on the second metal line 63.

A color filter layer 64 is formed on the deposited second insulating interlayer 62.

A device protecting layer 65, which may be an insulating layer, is deposited on the color filter layer 64 to protect the sensor against moisture or physical shock. A microlens 66 is formed on the device protecting layer 65.

Figure 14:
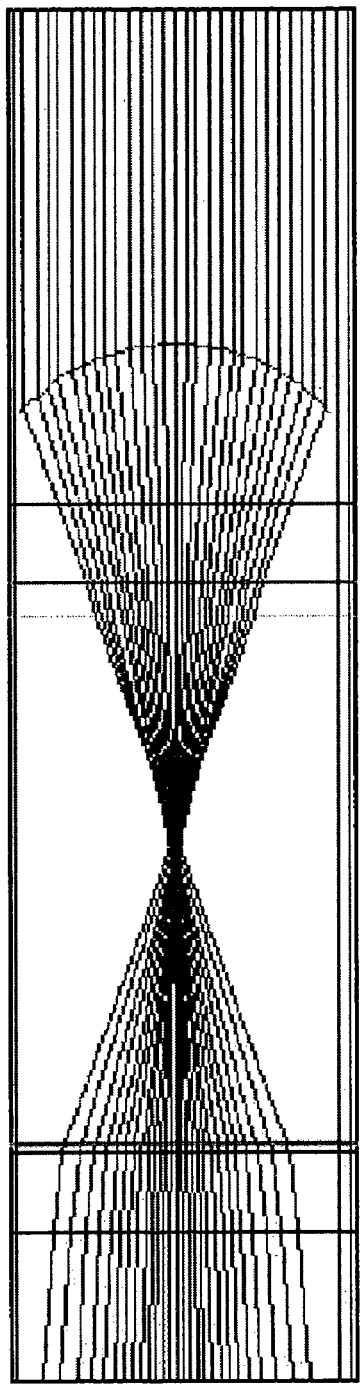
FIG. 14 is a diagram of simulation results of lay tracing of CMOS image sensors of the related art and the present invention.
Figure 14:
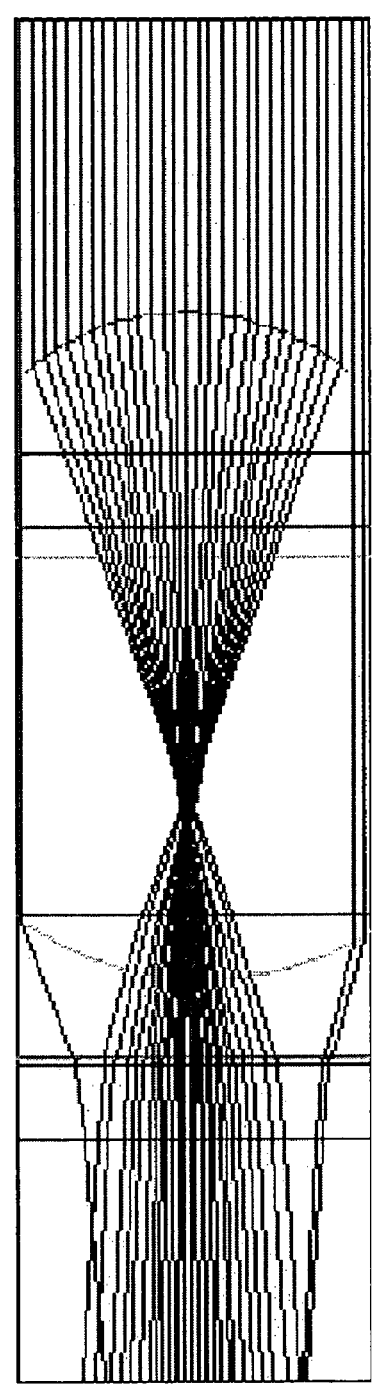

FIG. 14 is a diagram of simulation results of lay tracing of CMOS image sensors of the related art and the present invention. In (A) of FIG. 14, a lay tracing simulation result of a CMOS image sensor according to a related art is shown. In (B) of FIG. 14, a lay tracing simulation result of a CMOS image sensor according to the present invention is shown.

Referring to FIG. 14, the intensity of light condensed to the photodiode of the CMOS image sensor having an inner microlens according to the present invention is better than the intensity of light condensed to the photodiode of the CMOS image sensor having the microlens on a top layer according to the related art.

Accordingly, the present invention provides the following effects or advantages.

The dependency according to the increased focal length due to the highly integrated circuit can be reduced. In particular, the inner microlens as well as the microlens provided on a top layer compensates the loss of the light due to film interference or diffraction occurring when the light is incident on the photodiode. Hence, the sensing capability is increased to enhance a quality of image.

Also, the inner lens is formed by etching a silicon layer attached to the insulating interlayer to reduce the focal length. Hence, the present invention can further increase intensity of light incident on the photodiode.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of fabricating a CMOS image sensor, comprising:

forming a plurality of photodiodes on a semiconductor substrate;

alternately forming first insulating interlayers and first metal lines on a plurality of the photodiodes to thereby form the first insulating interlayer on the first metal line;

forming a plurality of inner microlenses on the first insulating interlayer;

alternately forming second insulating interlayers and second metal lines on a plurality of the inner microlenses to thereby form the second insulating interlayer on the second metal line;

forming a device protecting layer on the second insulating interlayer; and forming a plurality of microlenses on the device protecting layer;

wherein forming a plurality of inner microlenses comprises:

attaching a silicon layer on the first insulating layer wherein oxide layers are coated on top and bottom surfaces of the silicon layer, respectively;

forming a photoresist pattern on the silicon layer to expose an area corresponding to a plurality of the photodiodes;

forming concave recesses by wet etching performed on the silicon layer using the photoresist pattern as a mask; and forming a nitride layer on the semiconductor substrate including the concave recesses;

wherein forming concave recesses comprises:

generating an inverse triangle type profile by performing the wet etching on the silicon layer;

removing an oxide layer from a top surface of the silicon layer; and rounding the inverse triangle type profile by chemical dry etching to form each of the concave recesses.

* * * * *